(12) United States Patent
Parthasarathy et al.

(10) Patent No.: US 6,573,562 B2
(45) Date of Patent: Jun. 3, 2003

(54) SEMICONDUCTOR COMPONENT AND METHOD OF OPERATION

(75) Inventors: Vijay Parthasarathy, Phoenix, AZ (US); Ronghua Zhu, Chandler, AZ (US); Vishnu K. Khemka, Mesa, AZ (US); Amitava Bose, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/004,186

(22) Filed: Oct. 31, 2001

(65) Prior Publication Data

US 2003/0080381 A1 May 1, 2003

(51) Int. Cl.[7] .............................................. H01L 29/76
(52) U.S. Cl. ...................... 257/338; 259/299; 259/337; 259/339; 259/342; 438/270; 438/271
(58) Field of Search ................................. 257/299, 338, 257/337, 339, 342; 438/270, 271

(56) References Cited

U.S. PATENT DOCUMENTS 6,413,806 B1 * 7/2002 Sicard et al. ................ 437/197

OTHER PUBLICATIONS

"Self-aligned and shielded-resurf LDMOS for dense 20V power IC's," Ludikhuze et al., 1999 IEEE, pp. 81–84.
"SOA improvement by a double resurf LDMOS technique in a power IC technology," Parthasarathy et al., 2000 IEEE, pp. 4.2.1–4.2.4.
"Multi–ring active analog protection for minority carrier injection suppression in smart power technology," Gonnard et al., Proceedings of 2001 international symposium on power semiconductor devices & IC's, Osaka, pp. 351–354.
"DC substrate coupling between LDMOS and CMOS devices in hyperintegration I technology," Venkatesan et al., 1998 IEEE, pp. 57–60.
"Multi–voltage device integration technique for 0.5 u m BICMOS & DMOS process," Terashima et al., 2000 IEEE, pp. 331–334.
"Supression of a substrate injection by resurf LDMOS devices in a smart power technology for 20–30v applications," Parthasarathy et al., 1998 IEEE, pp. 184–186.

* cited by examiner

Primary Examiner—Sara Crane
Assistant Examiner—Junghwa Im (57) ABSTRACT

A semiconductor component includes a semiconductor substrate (110) having first and second portions (111, 112) with a first conductivity type, a transistor (120) at least partially located in the semiconductor substrate, and a switching circuit (150, 350, 650, 850). The transistor includes (i) a first doped region in the first portion of the semiconductor substrate and having the first conductivity type (ii) a terminal, which includes a second doped region having a second conductivity type and located in the first portion of the semiconductor substrate and over the first doped region, and (iii) a third doped region having the second conductivity type and located in the semiconductor substrate below the first portion of the semiconductor substrate and above the second portion of the semiconductor substrate. The switching circuit is electrically coupled to the third doped region to adjust the bias of the third doped region.

27 Claims, 10 Drawing Sheets

SEMICONDUCTOR COMPONENT AND METHOD OF OPERATION

FIELD OF THE INVENTION

This invention relates to electronics, in general, and to semiconductor components and methods of operation, in particular.

BACKGROUND OF THE INVENTION

Different types of semiconductor components are often used in automotive and other high voltage applications. These different types of semiconductor components include discrete devices and integrated circuits. As an example, the discrete devices can be power Metal-Oxide-Semiconductor (MOS) transistors having source, gate, and drain terminals. These different types of semiconductor components have been combined onto a single semiconductor chip to reduce the cost and space required for the semiconductor components.

One significant problem of these combined semiconductor components occurs when the drain terminal of the power MOS transistor is forward biased. The forward biasing of the drain terminal injects minority carriers into the semiconductor substrate, and the minority carriers degrade the performance of the integrated circuit or circuits located on the same semiconductor chip.

Several prior attempts have been made to either contain the injected minority carriers or suppress the injection of minority carriers. These prior attempts, however, still have disadvantages of low drain-to-source breakdown voltage, large epitaxial semiconductor layer thickness, and/or non-isolated power transistors.

Accordingly, a need exists for a semiconductor component with a power transistor combined with an integrated circuit onto a single semiconductor chip where the power transistor has a high drain-to-source breakdown voltage and is isolated from the integrated circuit. A need also exists for the epitaxial semiconductor layer, in which the power device and the integrated circuit are formed, to have a small thickness. A further need exists for a method of operating a semiconductor component to suppress the injection of minority carriers into the semiconductor substrate.

BRIEF DESCRIPTION OF THE DRAWINGS

The invention will be better understood from a reading of the following detailed description, taken in conjunction with the accompanying figures in the drawings in which.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale. For example, the dimensions of some of the elements in the figures may be exaggerated relative to other elements to help to improve understanding of embodiments of the present invention. Furthermore, the same reference numerals in different figures denote the same elements.

Furthermore, the terms first, second, third, and the like in the description and in the claims, if any, are used for distinguishing between similar elements and not necessarily for describing a sequential or chronological order. It is further understood that the terms so used are interchangeable under appropriate circumstances such that the embodiments of the invention described herein are, for example, capable of operation in other sequences than illustrated or otherwise described herein.

Moreover, the terms front, back, top, bottom, over, under, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than illustrated or otherwise described herein.

DETAILED DESCRIPTION OF THE DRAWINGS

Figure 1:
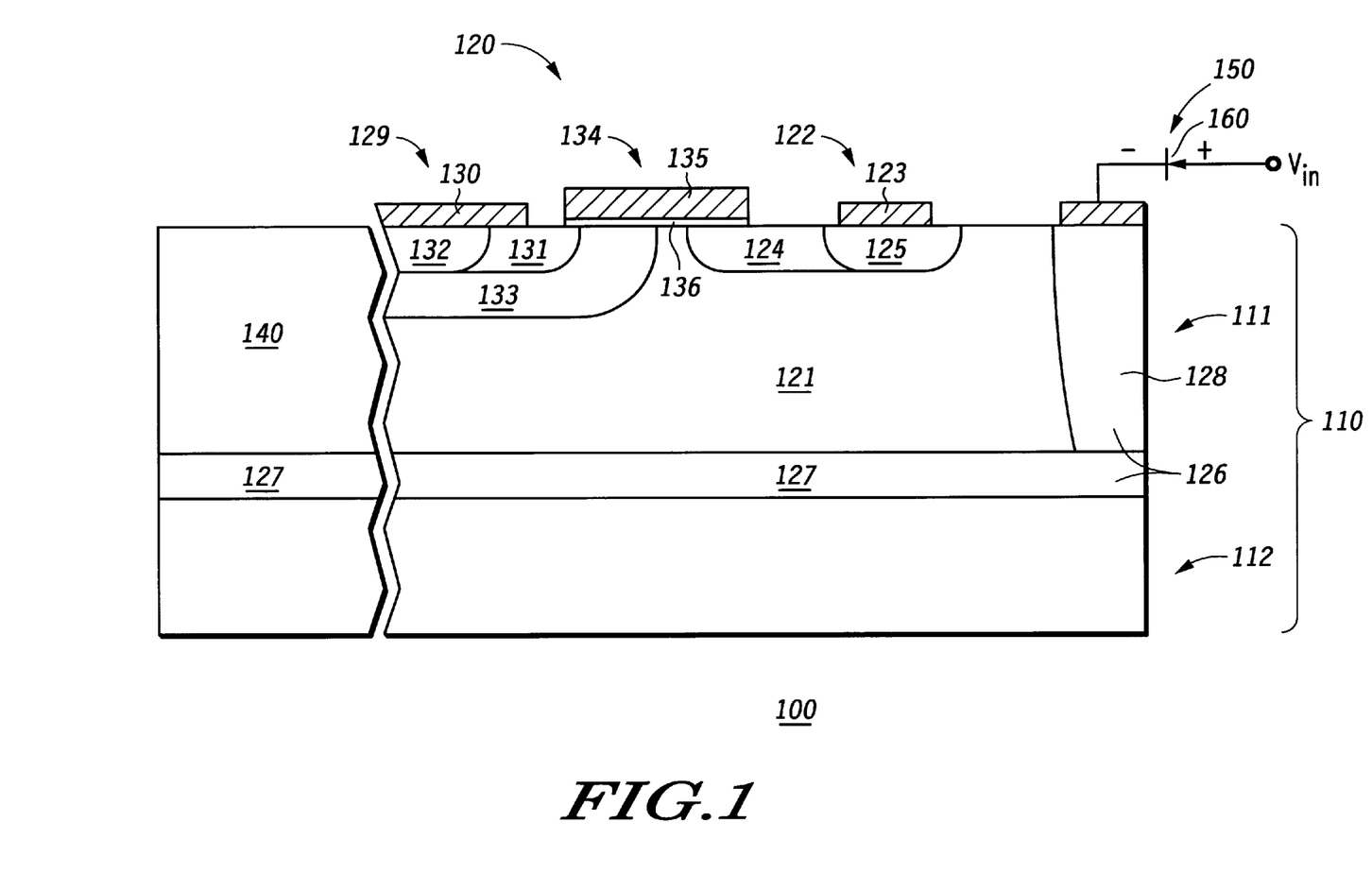
FIG. 1 illustrates a partially schematic, cross-sectional view of a semiconductor component in accordance with an embodiment of the invention.

FIG. 1 illustrates a partially schematic, cross-sectional view of a semiconductor component 100. As an example, semiconductor component 100 can be electrically coupled to a forty-volt power supply (not shown in FIG. 1). Semiconductor component 100 comprises a semiconductor substrate 110 having portions 111 and 112 with a first conductivity type. In the preferred embodiment, the first conductivity type can be a P-type conductivity. In an alternative embodiment, the first conductivity type can be an N-type conductivity. As an example, portion 111 can be an epitaxial portion having a preferred thickness of less than approximately four micrometers. As a further example, portion 112 can be a substrate portion having a different doping concentration than portion 111.

The semiconductor component also comprises a transistor 120 at least partially located in semiconductor substrate 110. Transistor 120 is a high power or high voltage transistor. As an example, transistor 120 can be a MOS transistor or a Bipolar Junction Transistor (BJT) capable of withstanding approximately forty to one hundred volts across its drain and source terminals or its collector and emitter terminals. In the embodiment illustrated in FIG. 1, transistor 120 is a Laterally Diffused MOS (LDMOS) transistor.

Transistor 120 is comprised of a doped region 121 in portion 111 of semiconductor substrate 110 and having the first conductivity type. As an example, doped region 121 can also be referred to as a well region for transistor 120.

Transistor 120 also comprises a terminal 122 comprising an electrode 123 and a doped region having a second conductivity type and located in portion 111 of semiconductor substrate 110 and over doped region 121. In the preferred embodiment, the second conductivity type can be an N-type conductivity. In an alternative embodiment where the first conductivity type is an N-type conductivity, the second conductivity type can be a P-type conductivity. In the embodiment illustrated in FIG. 1, terminal 122 is a drain terminal for transistor 120. In a different embodiment where transistor 120 is a BJT, terminal 122 can be a collector terminal.

Also in the embodiment illustrated in FIG. 1, the doped region of terminal 122 is comprised of doped regions 124 and 125. As an example, doped regions 124 and 125 can be referred to as a drift region and a drain region, respectively. In this embodiment, doped region 125 has a higher doping concentration than doped regions 121 and 124.

Transistor 120 additionally comprises a doped region 126 having the second conductivity type and located in semiconductor substrate 110 below portion 111 of semiconductor substrate 110 and above portion 112 of semiconductor substrate 110. As an example, doped region 126 can be located in a lower portion of portion 111 of semiconductor substrate 110 and an upper portion of portion 112 of semiconductor substrate 110. Doped region 126 is comprised of doped regions 127 and 128. Doped region 127 can be referred to as a buried layer or buried region. Doped region 126 separates portion 111 of semiconductor substrate 110 from portion 112 of semiconductor substrate 110. Doped region 126 can have a higher doping concentration than doped regions 121 and 124 and a lower doping concentration than doped region 125.

Transistor 120 further comprises a terminal 129 comprising an electrode 130 and a doped region 131 having the second conductivity type and located in portion 111 of semiconductor substrate 110 and over doped region 121. In the embodiment illustrated in FIG. 1, terminal 129 can be referred to as a source terminal. In a different embodiment where transistor 120 is a BJT, terminal 129 can be referred to as an emitter terminal.

Transistor 120 still further comprises doped regions 132 and 133 having the first conductivity type. Doped region 133 can be referred to as a body region. As an example, doped region 132 can have a higher doping concentration than doped regions 121, 126, and 133.

Transistor 120 also comprises a terminal 134 comprising an electrode 135 and an electrically insulative layer 136, both located over a top surface of semiconductor substrate 110. In the embodiment illustrated in FIG. 1, terminal 134 can be referred to as a gate terminal. In a different embodiment where transistor 120 is a BJT, terminal 134 can be referred to as a base terminal.

In the embodiment illustrated in FIG. 1, transistor 120 additionally comprises an intrinsic BJT formed at least partially from doped regions 121, 125, and 126. As an example, when terminal 122 is forward biased with respect to doped region 121, doped region 121 can be the base region of the intrinsic BJT; doped region 125 can be the emitter of the intrinsic BJT; and doped region 126 can be the collector of the intrinsic BJT. As another example, when terminal 122 is reverse biased with respect to doped region 121, doped region 121 can be the base region of the intrinsic BJT; doped region 125 can be the collector of the intrinsic BJT; and doped region 126 can be the emitter of the intrinsic BJT. The intrinsic BJT is active or turned-on when terminal 122 is forward biased relative to doped region 121, and the intrinsic bipolar junction transistor is deactivated or turned-off when terminal 122 is reverse biased relative to doped region 121. The activation and deactivation of the intrinsic BJT are explained in more detail hereinafter.

In addition to semiconductor substrate 110 and transistor 120, semiconductor component 100 further comprises an integrated circuit 140 at least partially located in semiconductor substrate 110 and electrically coupled to transistor 120. Doped region 126 separates or isolates transistor 120 from integrated circuit 140.

Semiconductor component 100 still further comprises a switching circuit 150 electrically coupled to doped region 126 to adjust the bias of doped region 126. Switching circuit 150 is illustrated in schematic form in FIG. 1. In a first embodiment, switching circuit 150 is at least partially located in semiconductor substrate 110. In a second embodiment, switching circuit 150 is at least partially located over semiconductor substrate 110. In a third embodiment, switching circuit 150 is entirely located outside of semiconductor substrate 110.

Switching circuit 150 biases doped region 126 to prevent substrate injection when doped region 125 is forward biased with respect to doped region 121 and to prevent punch-through when doped region 125 is reverse-biased with respect to doped region 121. The use of switching circuit 150 eliminates the need for more costly and more complicated epitaxial layers having higher doping concentrations towards doped region 127 to prevent punch-through between the doped region 125 and doped region 126. The use of switching circuit 150 also eliminates the need for thicker epitaxial layers, which are incompatible with industry goals for thinner epitaxial layers, especially for fiber optic applications.

Switching circuit 150 also biases doped region 126 to activate and deactivate the intrinsic BJT in transistor 120. In the preferred embodiment, the biasing provided by switching circuit 150 is dynamically performed during the operation of transistor 120.

For example, switching circuit 150 biases doped region 126 in a direction identical to a biasing direction of terminal 122 when terminal 122 is reverse biased relative to doped region 121. In the preferred embodiment, such biasing of doped region 126 and terminal 122 occurs substantially simultaneously. This biasing de-activates or turns off the intrinsic BJT in transistor 120.

As another example, switching circuit 150 biases doped region 126 at zero volts or reverse bias relative to portion 112 of semiconductor substrate 110 when terminal 122 is forward biased relative to doped region 121. In the preferred embodiment, such biasing of doped region 126 and terminal 122 occurs substantially simultaneously. This biasing deactivates or turns off the intrinsic BJT in transistor 120.

In the embodiment illustrated in FIG. 1, switching circuit 150 comprises a single diode 160. As illustrated in FIG. 1, diode 160 is a P-N diode and is electrically coupled to buried region 126. Diode 160 can be at least partially located in semiconductor substrate 110. In this embodiment, buried region 126 can be electrically floating.

When terminal 122 is forward biased with respect to doped region 121, the voltage of doped region 126 equals Vin, and the BJT is activated. When terminal 122 is reverse biased with respect to doped region 121 and is larger than Vin, the voltage of doped region 126 equals the voltage at terminal 122, and the intrinsic BJT is de-activated.

Figure 2:
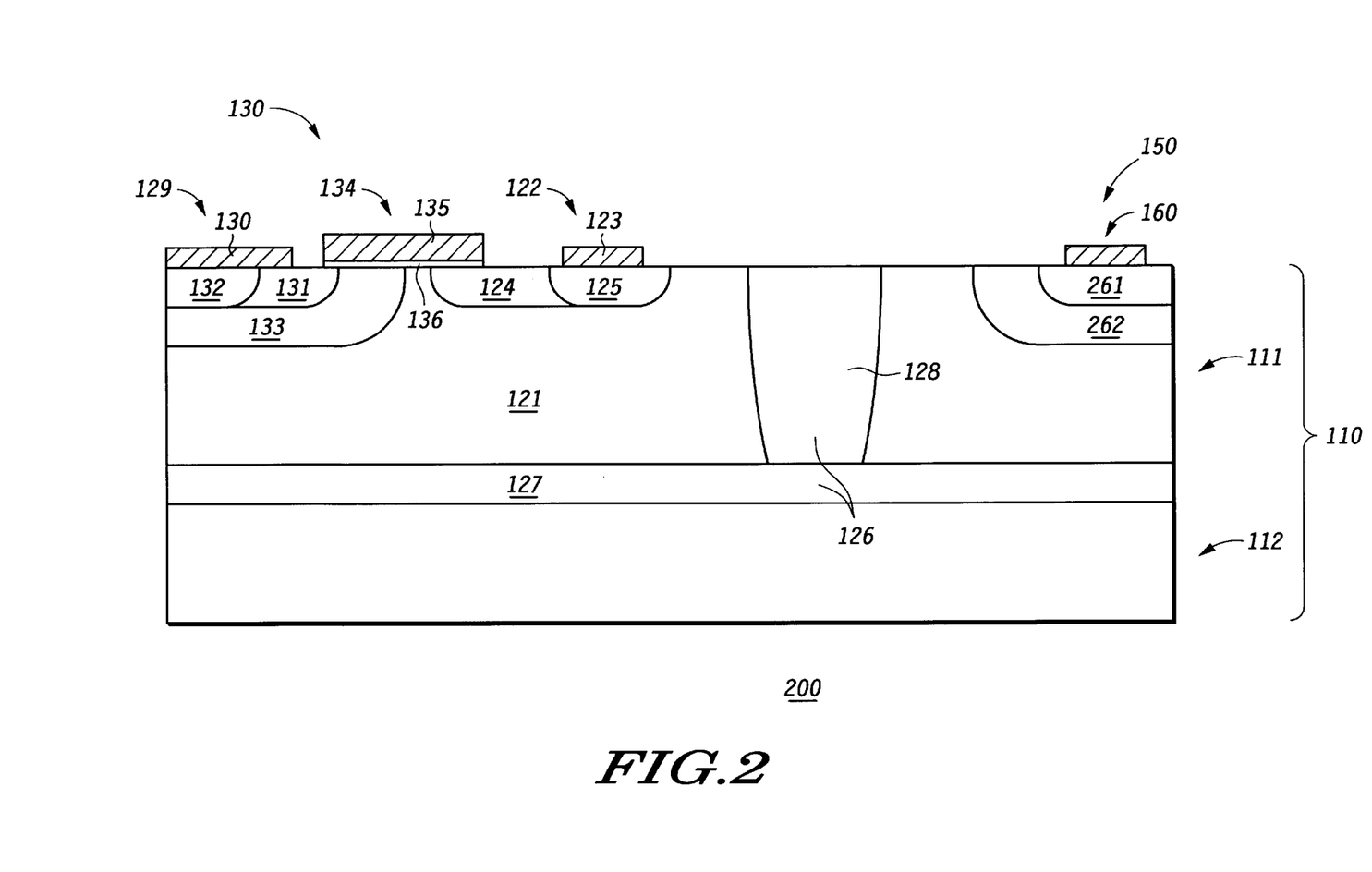
FIG. 2 illustrates a cross-sectional view of an embodiment of the semiconductor component of FIG. 1 in accordance with an embodiment of the invention.

FIG. 2 illustrates a cross-sectional view of a semiconductor component 200, which is an embodiment of semiconductor component 100 in FIG. 1. For simplicity, integrated circuit 140 in FIG. 1 is not illustrated in FIG. 2. Diode 160 in semiconductor component 200 in FIG. 2 comprises a doped region 261 in portion 111 of semiconductor substrate 110, a doped region 262 in portion 111 of semiconductor substrate 110, a portion of portion 111 of semiconductor substrate 110, and doped region 126. Doped regions 261 and 262 have the first conductivity type, and doped region 261 has a higher doping concentration than doped region 262 and the portion of portion 111 of semiconductor substrate 110.

Diode 160 can be added to semiconductor component 200 without requiring any additional manufacturing steps. For example, doped region 261 can be formed simultaneously with doped region 132, and doped region 262 can be formed simultaneously with doped region 133.

Figure 3:
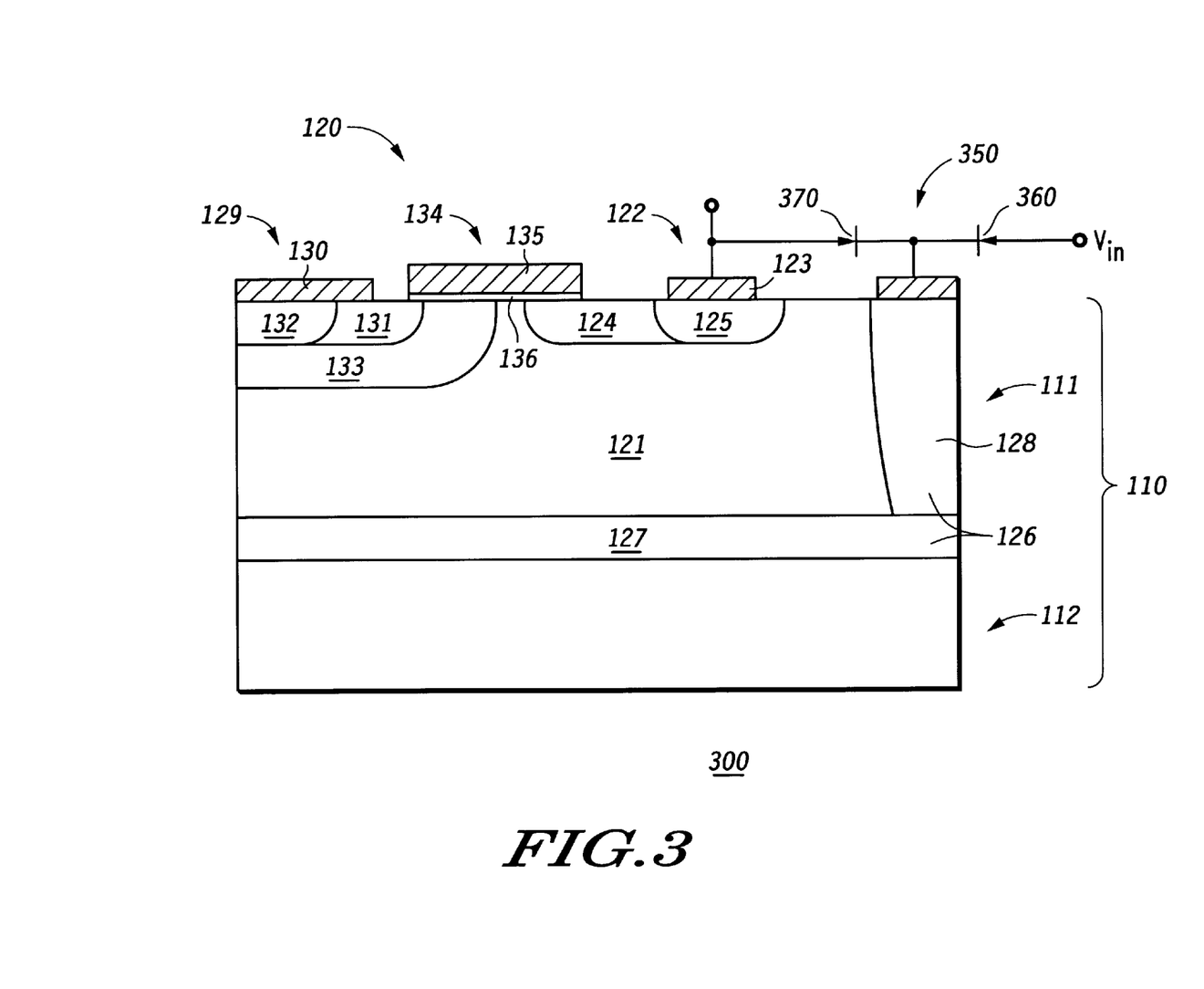
FIG. 3 illustrates a partially schematic, cross-sectional view of a semiconductor component in accordance with an embodiment of the invention.

FIG. 3 illustrates a partially schematic, cross-sectional view of a semiconductor component 300, which can be a different embodiment of semiconductor component 100 in FIG. 1. Similar to semiconductor component 100 in FIG. 1, semiconductor component 300 in FIG. 3 comprises transistor 120 and integrated circuit 140. For simplicity, integrated circuit 140 in FIG. 1 is not illustrated in FIG. 3.

Semiconductor component 300 of FIG. 3 also comprises a switching circuit 350. Switching circuit 350 comprises diodes 360 and 370. As illustrated in FIG. 3, diodes 360 and 370 are P-N diodes electrically coupled to each other. As an example, diodes 360 and 370 can be configured in a back-to-back arrangement where diode 370 electrically couples together doped region 125 and doped region 126 and where diode 360 electrically couples together doped region 126 and an input voltage (Vin). Diodes 360 and 370 can be at least partially located in semiconductor substrate 110.

In operation, when the voltage applied to terminal 122 is greater than the input voltage, diode 370 is turned on, and diode 360 is turned off. Under these conditions, doped region 126 is approximately electrically shorted or otherwise electrically coupled to terminal 122. Also under these conditions, transistor 120 has a high drain-to-source breakdown voltage. When the voltage applied to terminal 122 is less than the input voltage, diode 370 is turned off, and diode 360 is turned on. Under these conditions, doped region 126 is not electrically shorted to terminal 122.

As an example, the input voltage can be offset from the voltage applied to terminal 122 by approximately fifteen volts or less. Accordingly, diode 370 is preferably a high voltage diode, and diode 360 can be a low voltage diode. In the preferred embodiment where semiconductor component 300 operates on a forty-volt power supply, the input voltage is approximately one to five volts.

Figure 4:
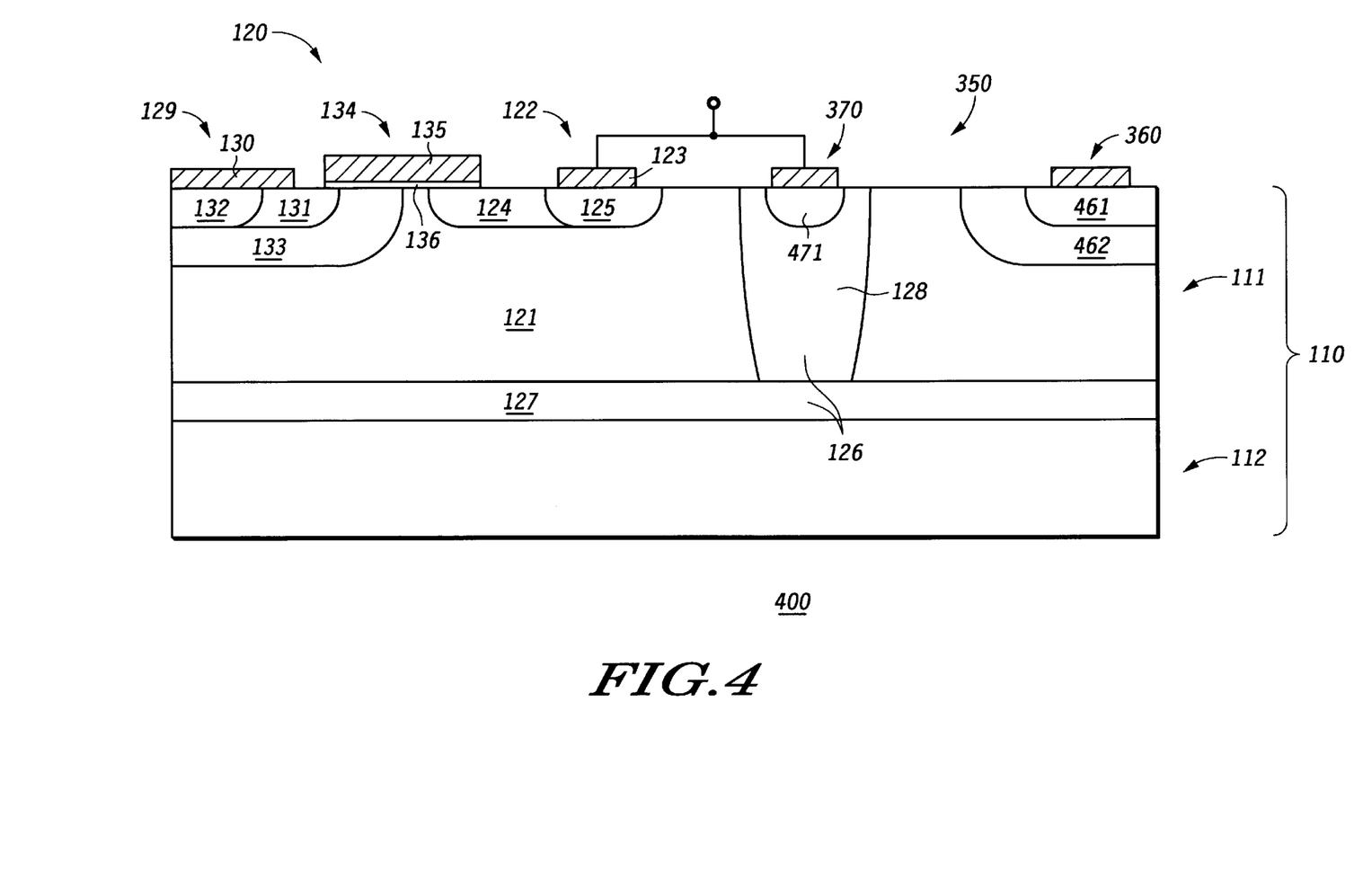
FIG. 4 illustrates a cross-sectional view of a first embodiment of the semiconductor component of FIG. 3 in accordance with an embodiment of the invention.

FIG. 4 illustrates a cross-sectional view of a semiconductor component 400, which is an embodiment of semiconductor component 300 in FIG. 3. Diode 360 in semiconductor component 400 in FIG. 4 comprises a doped region 461 in portion 111 of semiconductor substrate 110, a doped region 462 in portion 111 of semiconductor substrate 110, a portion of portion 111 of semiconductor substrate 110, and doped region 126. Doped regions 461 and 462 have the first conductivity type, and doped region 461 has a higher doping concentration than doped region 462 and the portion of portion 111 of semiconductor substrate 110. Diode 370 in semiconductor component 400 comprises a doped region 471 and doped region 126. Doped region 471 has the first conductivity type. Preferably, doped region 462 is separated from doped region 128 by approximately two to five microns.

Diodes 360 and 370 can be added to semiconductor component 400 without requiring any additional manufacturing steps. For example, doped regions 461 and 471 can be formed simultaneously with doped region 132, and doped region 462 can be formed simultaneously with doped region 133.

Empirical results for a semiconductor component, such as semiconductor component 400, have demonstrated that the back-to-back diode scheme of diodes 360 and 370 is fast enough to switch simultaneously with transistor 120 to prevent premature breakdown within transistor 120.

Figure 5:
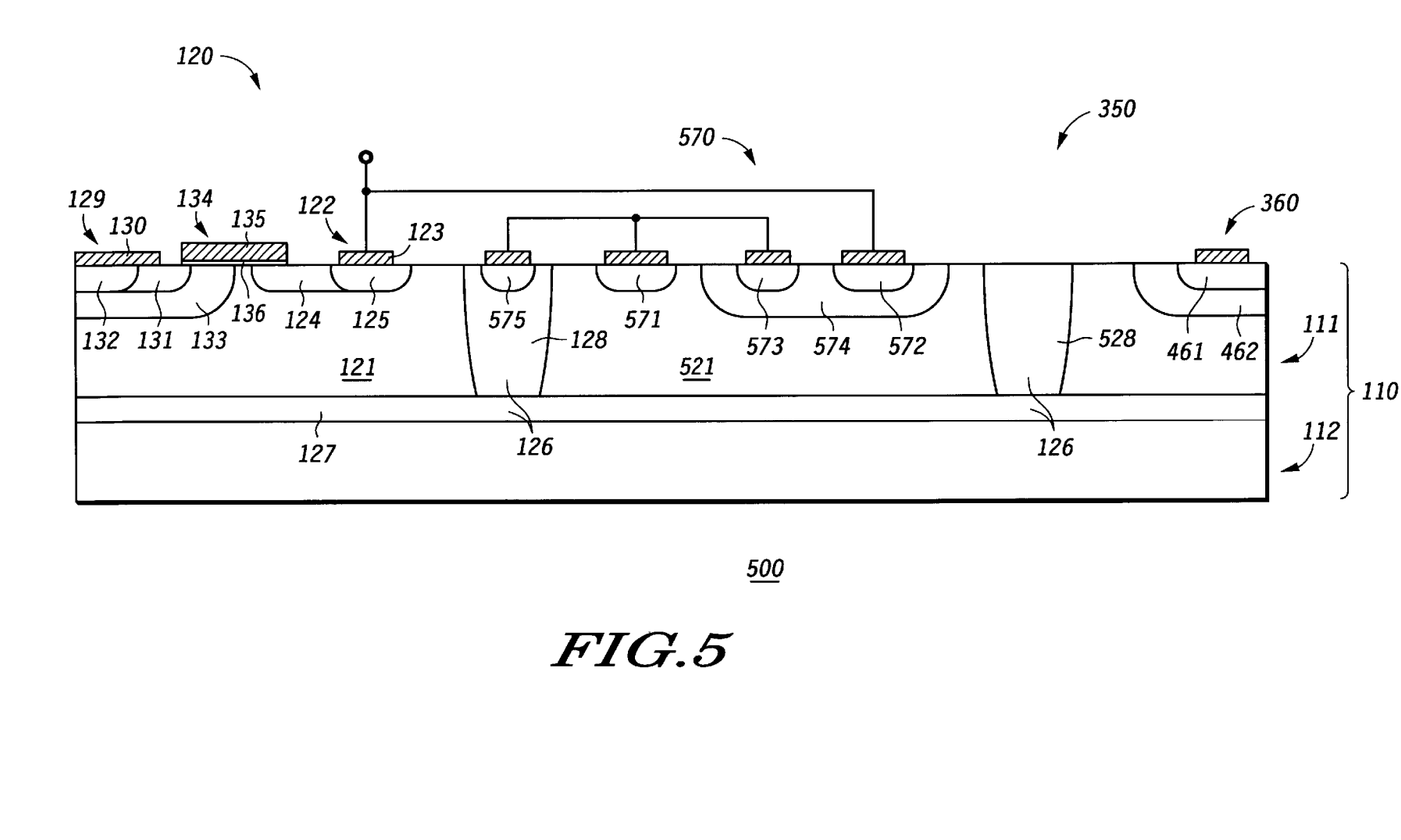
FIG. 5 illustrates a cross-sectional view of a second embodiment of the semiconductor component of FIG. 3 in accordance with an embodiment of the invention.

FIG. 5 illustrates a cross-sectional view of a semiconductor component 500, which is an embodiment of semiconductor component of FIG. 3. In place of diode 370 in semiconductor component 400 of FIG. 4, semiconductor component 500 in FIG. 5 comprises a diode 570 that is at least partially formed in semiconductor substrate 110. Diode 570 comprises doped regions 521, 571, 572, 573, and 574. Doped regions 521, 571, and 572 have the first conductivity type, and doped regions 573 and 574 have the second conductivity type. Doped regions 571 and 572 have higher doping concentrations than doped region 521, and doped region 573 has a higher doping concentration than doped region 574.

Diode 570 is formed from a BJT having its emitter terminal electrically coupled to doped region 125 and having its base and collector terminals electrically coupled to each other and to doped region 128. The electrical coupling together of the base and collector terminals to doped region 128 is facilitated by a doped region 575 of the second conductivity type. The collector terminal for the BJT comprises doped regions 571 and 521; the base terminal for the BJT comprises doped regions 573 and 574; and the emitter terminal for the BJT comprises doped region 572.

Diode 570 also comprises doped regions 127, 128, and 528, which electrically isolate diode 570 from transistor 120. Diode 370 in FIG. 3 is not electrically isolated from transistor 120 in semiconductor component 300. Therefore, under certain conditions, diode 376 may inject undesirable minority carriers into transistor 120. This problem of diode 370 in FIG. 3 is eliminated by diode 570 in FIG. 5. For semiconductor component 500 in FIG. 5, doped region 126 can comprise doped regions 127, 128, and 528.

Diode 570 can be added to semiconductor component 500 without requiring any additional manufacturing steps. For example, doped regions 571 and 572 can be formed simultaneously with doped regions 132 and 461, and doped regions 573 and 575 can be formed simultaneously with doped regions 125 and 131. Additionally, doped region 574 can be formed simultaneously with other base regions of other BJTs in the integrated circuit of semiconductor component 500, and doped region 521 can be formed simultaneously with doped region 121. Furthermore, doped region 528 can be formed simultaneously with doped region 128.

Figure 6:
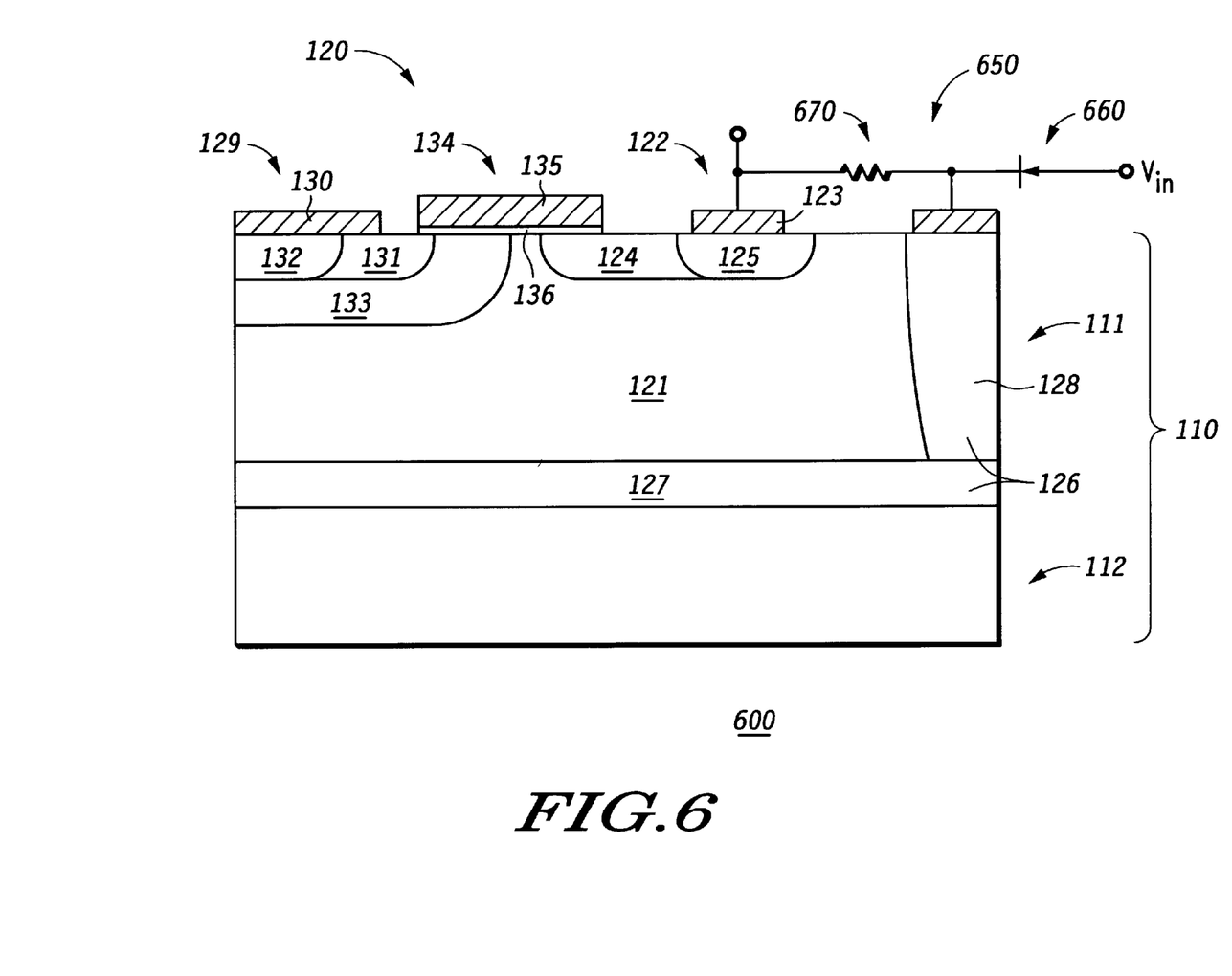
FIG. 6 illustrates a partially schematic, cross-sectional view of a semiconductor component in accordance with an embodiment of the invention.

FIG. 6 illustrates a partially schematic, cross-sectional view of a semiconductor component 600, which can be a different embodiment of semiconductor component 100 in FIG. 1. Similar to semiconductor component 100 in FIG. 1, semiconductor component 600 in FIG. 6 comprises transistor 120 and integrated circuit 140. For simplicity, integrated circuit 140 in FIG. 1 is not illustrated in FIG. 6.

Semiconductor component 600 of FIG. 6 also comprises a switching circuit 650. Switching circuit 650 comprises a diode 660 and a resistor 670. As illustrated in FIG. 6, diode 660 and resistor 670 are electrically coupled to each other. As an example, diode 660 and resistor 670 can be configured such that resistor 670 electrically couples together terminal 122 and doped region 126 and where diode 660 electrically couples together doped region 126 and an input voltage (Vin). Diode 660 and resistor 670 can be at least partially located in semiconductor substrate 110.

In operation, when the voltage applied to terminal 122 is greater than the input voltage, at least part of the voltage is dropped across resistor 670, and diode 660 is turned off. Under these conditions, doped region 126 is electrically coupled to terminal 122. Also under these conditions, transistor 120 has a high drain-to-source breakdown voltage. When the voltage applied to terminal 122 is less than the input voltage, diode 660 is turned on. Under these conditions, doped region 126 is not electrically shorted to terminal 122.

As an example, the input voltage can be offset from the voltage applied to terminal 122 by approximately fifteen volts or less. Accordingly, resistor 670 preferably has a high resistance, and diode 660 can be a low voltage diode. In the preferred embodiment where semiconductor component 600 operates on a forty-volt power supply, the input voltage is approximately one to five volts.

Figure 7:
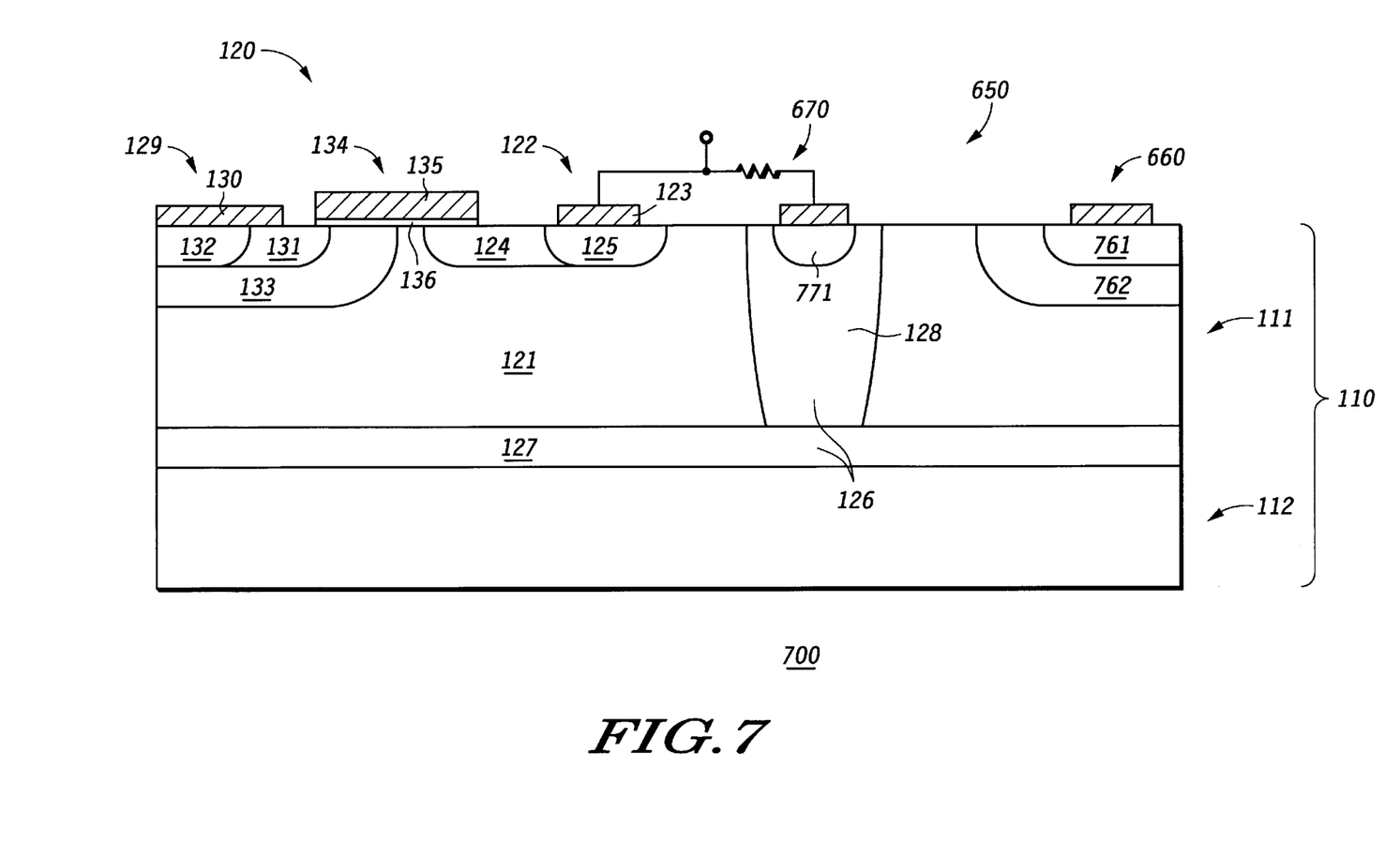
FIG. 7 illustrates a cross-sectional view of an embodiment of the semiconductor component of FIG. 6 in accordance with an embodiment of the invention.

FIG. 7 illustrates a cross-sectional view of a semiconductor component 700, which is an embodiment of semiconductor component 600 of FIG. 6. Diode 660 in semiconductor component 700 in FIG. 7 comprises a doped region 761 in portion 111 of semiconductor substrate 110, a doped region 762 in portion 111 of semiconductor substrate 110, a portion of portion 111 of semiconductor substrate 110, and doped region 126. Doped regions 761 and 762 have the first conductivity type, and doped region 761 has a higher doping concentration than doped region 762 and the portion of portion 111 of semiconductor substrate 110. Preferably, doped region 762 is separated from doped region 128 by approximately two to five microns.

Semiconductor component 700 also comprises a doped region 771 having the second conductivity type to facilitate the electrical coupling between doped region 126 and resistor 670. Resistor 670 in semiconductor component 700 is preferably formed over the top surface of semiconductor substrate 110. Resistor 670 is also preferably comprised of polycrystalline silicon. In a different embodiment, resistor 670 can be formed at least partially within semiconductor substrate 110.

Diode 660 can be added to semiconductor component 700 without requiring any additional manufacturing steps. For example, doped region 761 can be formed simultaneously with doped region 132, and doped region 762 can be formed simultaneously with doped region 133. Furthermore, doped region 771 can be formed simultaneously with doped regions 125 and 131.

Figure 8:
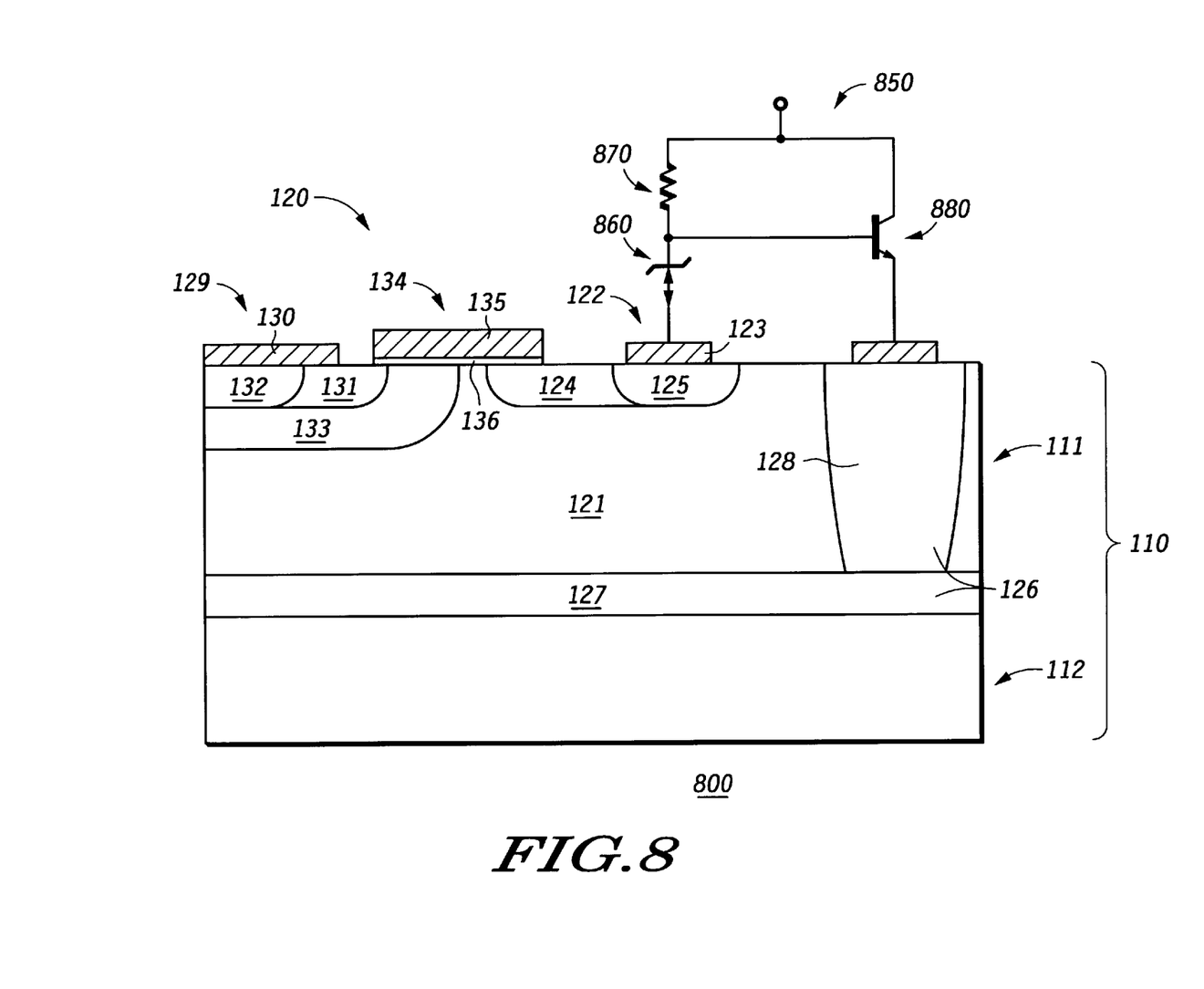
FIG. 8 illustrates a partially schematic, cross-sectional view of a semiconductor component in accordance with an embodiment of the invention.

FIG. 8 illustrates a partially schematic, cross-sectional view of a semiconductor component 800, which can be a different embodiment of semiconductor component 100 in FIG. 1. Similar to semiconductor component 100 in FIG. 1, semiconductor component 800 in FIG. 8 comprises transistor 120 and integrated circuit 140. For simplicity, integrated circuit 140 in FIG. 1 is not illustrated in FIG. 8.

Semiconductor component 800 of FIG. 8 also comprises a switching circuit 850. Switching circuit 850 comprises a diode 860, a resistor 870, and a transistor 880. As illustrated in FIG. 8, diode 860, resistor 870, and transistor 880 are electrically coupled to each other. Diode 860, resistor 870, and transistor 880 can be at least partially located in semiconductor substrate 110.

For example, transistor 880 can be a BJT having an emitter terminal, a base terminal, and a collector terminal. Transistor 880 is electrically coupled to doped region 126. As illustrated in FIG. 8, the emitter terminal of transistor 880 is electrically coupled to doped region 128 of doped region 126.

As another example, diode 860 can be a Zener diode. Diode 860 electrically couples terminal 122 to transistor 880 and resistor 870. As illustrated in FIG. 8, diode 860 electrically couples doped region 125 to the base terminal of transistor 880.

As a further example, resistor 870 can be a polycrystalline silicon resistor and can have a high resistance. Resistor 870 electrically couples the collector terminal of transistor 880 to diode 860 and the base terminal of transistor 880.

The voltage of doped region 126 equals the voltage of terminal 122 plus a voltage drop across the reverse-biased Zener diode minus a voltage drop across the base to emitter of the transistor. For example, if the base-to-emitter voltage equals approximately 0.7 volts and the drop across diode 860 equals approximately 5 volts, then the voltage of doped region 126 is approximately 4.3 volts higher than voltage of terminal 122. Hence, when terminal 122 is forward biased with respect to doped region 121, then the injected current from doped region 125 is collected by doped region 126. Also, when terminal 122 is reverse biased with respect to doped region 121, then the offset voltage between doped region 126 and terminal 122 causes the BJT to be de-activated or turned-off.

Figure 9:
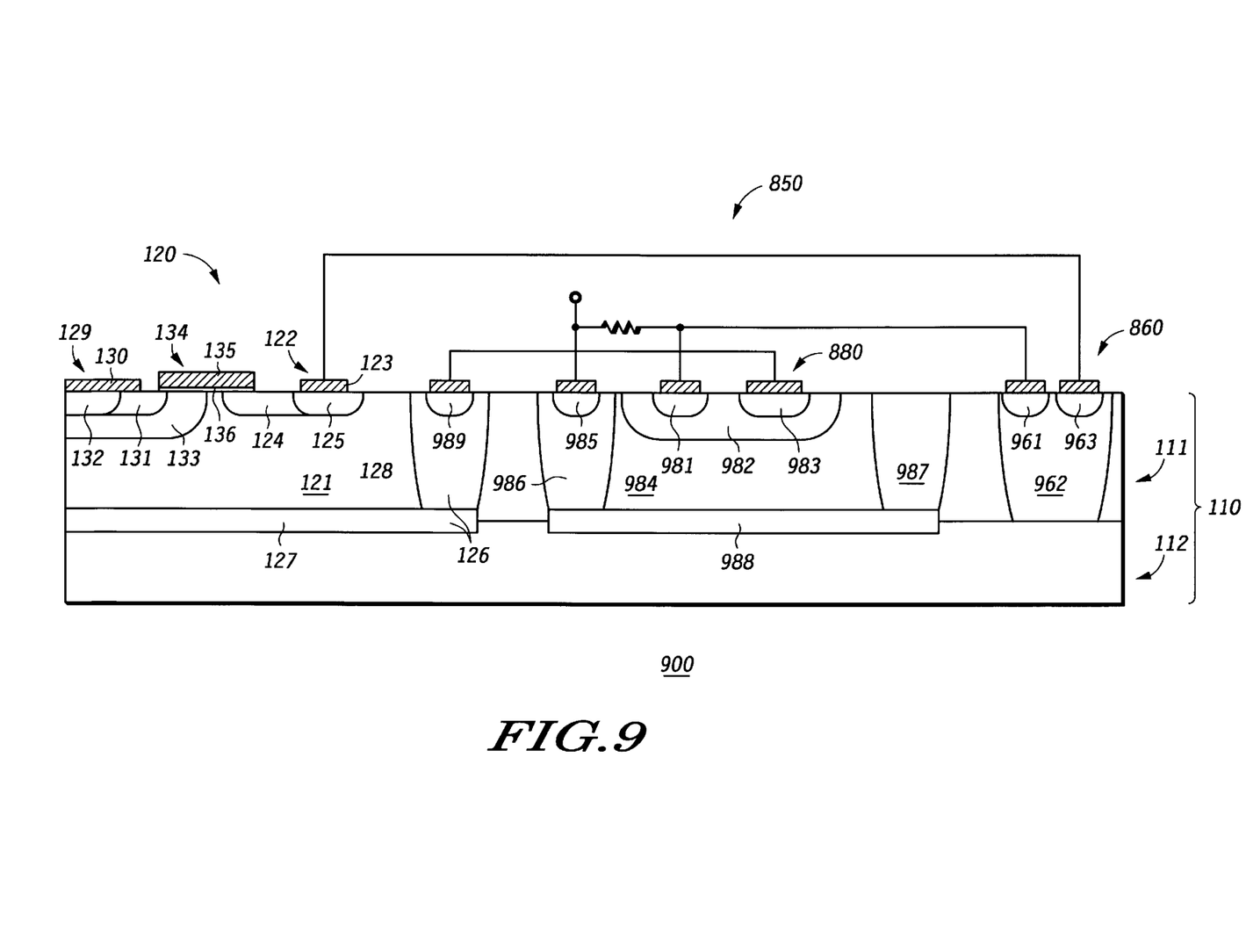
FIG. 9 illustrates a cross-sectional view of an embodiment of the semiconductor component of FIG. 8 in accordance with an embodiment of the invention.

FIG. 9 illustrates a cross-sectional view of a semiconductor component 900, which is an embodiment of semiconductor component 800 of FIG. 8. Transistor 880 in semiconductor component 900 comprises doped regions 981, 982, 983, 984, 985, 986, 987, and 988. Doped regions 981 and 982 have the first conductivity type, and doped regions 983, 984, 985, 986, 987, and 988 have the second conductivity type. Doped region 981 has a higher doping concentration than doped region 982, and doped regions 983 and 985 have higher doping concentrations than doped regions 984, 986, 987, and 988. Doped regions 986, 987, and 988 have higher doping concentrations than doped region 984.

As illustrated in FIG. 8, transistor 880 is a BJT with emitter, collector, and base terminals. The collector terminal for the BJT comprises doped regions 984, 985, 986, 987, and 988; the base terminal for the BJT comprises doped regions 981 and 982; and the emitter terminal for the BJT comprises doped region 983. The emitter terminal of transistor 880 is electrically coupled to doped region 128, and this electrical coupling is facilitated by a doped region 989 of the second conductivity type. Doped regions 986, 988, and 987 electrically isolate transistor 880 from transistor 120.

Diode 860 comprises doped regions 961, 962, and 963. Doped regions 961 and 962 have the second conductivity type, and doped region 963 has the first conductivity type. Doped region 961 has a higher doping concentration than doped region 962.

Diode 860 and transistor 880 can be added to semiconductor component 800 without requiring any additional manufacturing steps. For example, doped regions 961, 983, 985, and 989 can be formed simultaneously with doped regions 125 and 131, and doped regions 963 and 981 can be formed simultaneously with doped region 132. Additionally, doped regions 962, 986, and 987 can be formed simultaneously with doped region 128, and doped region 988 can be formed simultaneously with doped region 127. Furthermore, doped regions 982 and 984 can be formed simultaneously with other base and collector regions of other BJTs in the integrated circuit of semiconductor component 900.

Figure 10:
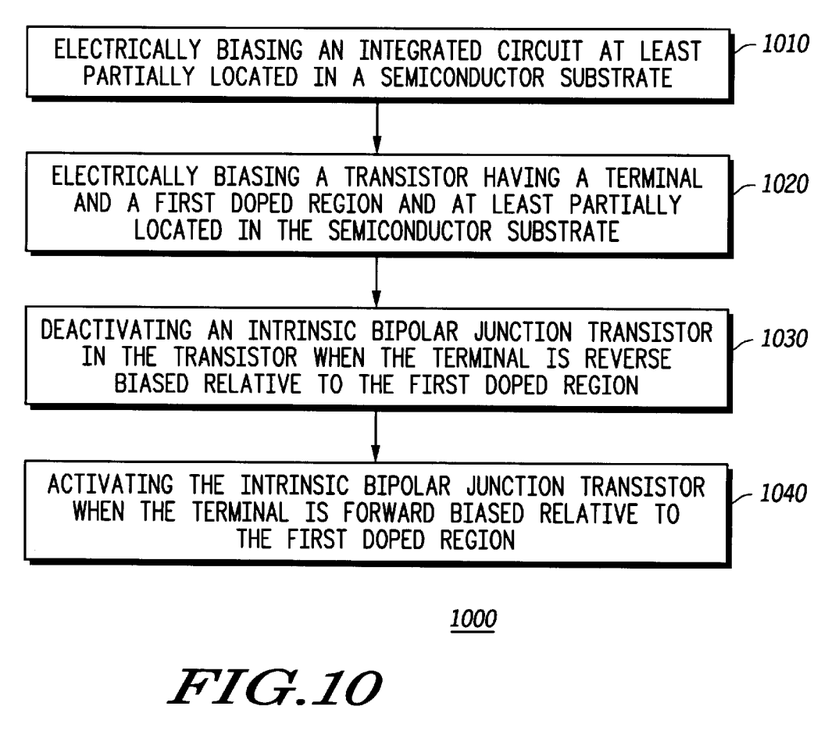
FIG. 10 illustrates a flow chart of a method of operating a semiconductor component in accordance with an embodiment of the invention.

FIG. 10 illustrates a flow chart 1000 of a method of operating a semiconductor component. As an example, the semiconductor component of flow chart 1000 can be similar to semiconductor components 100, 200, 300, 400, 500, 600, 700, 800, and/or 900 in FIGS. 1, 2, 3, 4, 5, 6, 7, 8, and 9, respectively. At a step 1010 of flow chart 1000 in FIG. 10, an integrated circuit at least partially located in a semiconductor substrate is electrically biased. As an example, the integrated circuit can be similar to integrated circuit 140 in FIG. 1.

At a step 1020 of flow chart 1000 in FIG. 10, a transistor at least partially located in the semiconductor substrate is electrically biased. As an example, the transistor can be similar to transistor 120 in FIGS. 1, 2, 3, 4, 5, 6, 7, 8, and 9. In particular, the transistor in step 1020 of FIG. 10 can comprise (1) a first doped region in a first portion of the semiconductor substrate and having a first conductivity type, (2) a terminal comprising a second doped region having a second conductivity type and located in the first portion of the semiconductor substrate and over the first doped region, (3) a third doped region having the second conductivity type, located in the semiconductor substrate below the first portion of the semiconductor substrate and above a second portion of the semiconductor substrate having the first conductivity type, and separating the first portion of the semiconductor substrate from the second portion of the semiconductor substrate, and (4) an intrinsic bipolar junction transistor formed at least partially from the first, second, and third doped regions.

At a step 1030 of flow chart 1000 in FIG. 10, the intrinsic bipolar junction transistor is deactivated when the drain terminal is reverse biased relative to the first doped region. As an example, the third doped region can be electrically biased to deactivate the intrinsic bipolar junction transistor. In particular, the third doped region can be electrically biased in a direction identical to a biasing direction of the terminal when the terminal is reverse biased relative to the first doped region. Step 1030 of flow chart 1000 prevents or otherwise suppresses the generation and injection of minority carriers into a substrate portion or the second portion of the semiconductor substrate.

At a step 1040 of flow chart 1000 in FIG. 10, the intrinsic bipolar junction transistor is activated when the drain terminal is forward biased relative to the first doped region. As an example, the third doped region can be electrically biased to activate the intrinsic bipolar junction transistor. In particular, the third doped region can be electrically biased at zero volts or reverse bias relative to the second portion of the semiconductor substrate when the terminal is forward biased relative to the first doped region. Step 1040 of flow chart 1000 enables the transistor of step 1020 to have a high drain-to-source breakdown voltage.

In general, steps 1020 and 1030 of flow chart 1000 prevent punch-through between the second doped region and the third doped region of the transistor. One skilled in the art will understand that the sequence of steps in flow chart 1000 can be altered in many different ways. For example, step 1030 can be performed before step 1020. Additionally, steps 1010, 1020, and 1030 can be performed simultaneously with each other; and steps 1010, 1020, and 1040 can be performed simultaneously with each other.

Therefore, an improved semiconductor component and method of operation is provided to overcome the disadvantages of the prior art. For example, the semiconductor component has a power transistor combined with an integrated circuit onto a single semiconductor substrate where the power transistor has a high drain-to-source breakdown voltage and is electrically isolated from the integrated circuit. The semiconductor substrate can comprise a thin epitaxial semiconductor layer, in which the power transistor and the integrated circuit are formed. A method of operating a semiconductor component also suppresses the injection of minority carriers into the semiconductor substrate.

Although the invention has been described with reference to specific embodiments, it will be understood by those skilled in the art that various changes may be made without departing from the spirit or scope of the invention. For instance, the numerous details set forth herein such as, for example, the dimensions, the relative doping concentrations, and the specific diodes, resistors, and transistors used in the switching circuits are provided to facilitate the understanding of the invention and are not provided to limit the scope of the invention. As an example, the diodes in the switching circuits can be Schottky diodes, and the resistors in the switching circuits can be crystalline silicon diodes formed in the semiconductor substrate. Accordingly, the disclosure of embodiments of the invention is intended to be illustrative of the scope of the invention and is not intended to be limiting. It is intended that the scope of the invention shall be limited only to the extent required by the appended claims.

Benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. As used herein, the term "comprise," "include," "have," and any variations thereof, are intended to cover a non-exclusive inclusion, such that a process, method, article, or apparatus that comprises a list of elements does not include only those elements, but may include other elements not expressly listed or inherent to such process, method, article, or apparatus.

What is claimed is:

1. A semiconductor component comprising:
   a semiconductor substrate having first and second portions with a first conductivity type;
   a transistor at least partially located in the semiconductor substrate and comprising:
   a first doped region in the first portion of the semiconductor substrate and having the first conductivity type;
   a first terminal comprising a second doped region having a second conductivity type and located in the first portion of the semiconductor substrate and over the first doped region; and
   a third doped region having the second conductivity type and located in the semiconductor substrate below the first portion of the semiconductor substrate and above the second portion of the semiconductor substrate;
   a fourth doped region having the first conductivity type formed within the first doped region and electrically coupled to the first doped region;
   a second terminal electrically coupled to the fourth doped region for providing a bias to the fourth doped region and the first doped region; and a switching circuit electrically coupled to the third doped
region to adjust a bias of the third doped region,
wherein:
the third doped region separates the first portion of the
semiconductor substrate from the second portion of
the semiconductor substrate.

2. The semiconductor component of claim 1 wherein:
the switching circuit biases the third doped region to
prevent punch-through between the second and third
doped regions.

3. The semiconductor component of claim 1 wherein:
the switching circuit forward biases the third doped region
and the first terminal when the first terminal is reverse
biased relative to the first doped region.

4. The semiconductor component of claim 1 wherein:
the switching circuit biases the third doped region at zero
volts or reverse bias relative to the second portion of the
semiconductor substrate when the first terminal is forward biased relative to the first doped region.

5. The semiconductor component of claim 1 wherein:
the transistor further comprises:
an intrinsic bipolar junction transistor formed at least
partially from the first, second, and third doped
regions;
the intrinsic bipolar junction transistor is active when the
first terminal is forward biased relative to the first
doped region; and
the switching circuit deactivates the intrinsic bipolar
junction transistor when the first terminal is reverse
biased relative to the first doped region.

6. The semiconductor component of claim 1 wherein:
the switching circuit is at least partially located in the
semiconductor substrate.

7. The semiconductor component of claim 1 wherein:
the switching circuit is at least partially located over the
semiconductor substrate.

8. The semiconductor component of claim 1 wherein:
the switching circuit is entirely located outside of the
semiconductor substrate.

9. The semiconductor component of claim 1 wherein:
the switching circuit comprises a single diode.

10. The semiconductor component of claim 1 wherein:
the switching circuit comprises two diodes.

11. A semiconductor component comprising:
a semiconductor substrate having first and second portions with a first conductivity type;
a transistor at least partially located in the semiconductor
substrate and comprising:
a first doped region in the first portion of the semiconductor substrate and having the first conductivity
type;
a terminal comprising a second doped region having a
second conductivity type and located in the first
portion of the semiconductor substrate and over the
first doped region; and
a third doped region having the second conductivity
type and located in the semiconductor substrate
below the first portion of the semiconductor substrate
and above the second portion of the semiconductor
substrate; and
a switching circuit electrically coupled to the third doped
region to adjust a bias of the third doped region,
wherein:
the third doped region separates the first portion of the
semiconductor substrate from the second portion of
the semiconductor substrate; and
the switching circuit comprises a single diode.

12. A semiconductor component comprising:
a semiconductor substrate having first and second portions with a first conductivity type;
a transistor at least partially located in the semiconductor
substrate and comprising:
a first doped region in the first portion of the semiconductor substrate and having the first conductivity
type;
a terminal comprising a second doped region having a
second conductivity type and located in the first
portion of the semiconductor substrate and over the
first doped region; and
a third doped region having the second conductivity
type and located in the semiconductor substrate
below the first portion of the semiconductor substrate
and above the second portion of the semiconductor
substrate; and
a switching circuit electrically coupled to the third doped
region to adjust a bias of the third doped region,
wherein:
the third doped region separates the first portion of the
semiconductor substrate from the second portion of
the semiconductor substrate; and
the switching circuit comprises two diodes.

13. A semiconductor component comprising:
a semiconductor substrate having first and second portions with a first conductivity type;
a transistor at least partially located in the semiconductor
substrate and comprising:
a first doped region in the first portion of the semiconductor substrate and having the first conductivity
type;
a terminal comprising a second doped region having a
second conductivity type and located in the first
portion of the semiconductor substrate and over the
first doped region; and
a third doped region having the second conductivity
type and located in the semiconductor substrate
below the first portion of the semiconductor substrate
and above the second portion of the semiconductor
substrate; and
a switching circuit electrically coupled to the third doped
region to adjust a bias of the third doped region,
wherein:
the third doped region separates the first portion of the
semiconductor substrate from the second portion of
the semiconductor substrate; and
the switching circuit comprises a bipolar junction
transistor, a diode, and a resistor.

14. A semiconductor component comprising:
a semiconductor substrate having first and second portions with a first conductivity type;
a transistor at least partially located in the semiconductor
substrate and comprising:
a first doped region in the first portion of the semiconductor substrate and having the first conductivity
type;
a terminal comprising a second doped region having a
second conductivity type and located in the first
portion of the semiconductor substrate and over the
first doped region; and
a third doped region having the second conductivity
type and located in the semiconductor substrate
below the first portion of the semiconductor substrate
and above the second portion of the semiconductor
substrate; and a switching circuit electrically coupled to the third doped region to adjust a bias of the third doped region, wherein:
the third doped region separates the first portion of the semiconductor substrate from the second portion of the semiconductor substrate; and
the switching circuit comprises a resistor and a diode.

15. The semiconductor component of claim 11 wherein:
the two diodes are configured in a back-to-back arrangement.

16. The semiconductor component of claim 11 wherein:
a first one of the two diodes electrically couples together the second doped region and the third doped region; and
a second one of the two diodes electrically couples together the third doped region and an input voltage.

17. The semiconductor component of claim 1 wherein:
the switching circuit comprises:
 a bipolar junction transistor;
 a diode; and
 a resistor.

18. The semiconductor component of claim 13 wherein:
the diode is a Zener diode and electrically couples the second doped region to the bipolar junction transistor and the resistor; and
the bipolar junction transistor is electrically coupled to the third doped region.

19. The semiconductor component of claim 1 wherein:
the switching circuit comprises:
 a resistor; and
 a diode.

20. The semiconductor component of claim 14 wherein:
the resistor electrically couples together the second and third doped regions; and
the diode is electrically coupled to the third doped region and an input voltage.

21. A semiconductor component comprising:
a semiconductor substrate having a substrate portion with a first conductivity type and an epitaxial portion with the first conductivity type;
a MOS transistor at least partially located in the semiconductor substrate and comprising:
 a well region in the epitaxial portion of the semiconductor substrate and having the first conductivity type;
 a drain terminal comprising a drain region having a second conductivity type and located in the epitaxial portion of the semiconductor substrate and over the well region; and
 a buried region having the second conductivity type and located in the semiconductor substrate below the epitaxial portion of the semiconductor substrate and above the substrate portion of the semiconductor substrate;
a switching circuit at least partially located in the epitaxial portion of the semiconductor substrate and electrically coupled to the buried region to adjust a bias of the buried region; and
an integrated circuit at least partially located in the semiconductor substrate and electrically coupled to the MOS transistor, wherein:
the buried region separates the epitaxial portion of the semiconductor substrate from the substrate portion of the semiconductor substrate.

22. The semiconductor component of claim 21 wherein:
the switching circuit biases the buried region to prevent punch-through between the drain region and the buried region;
the switching circuit substantially simultaneously biases the buried region in a direction identical to a biasing direction of the drain terminal when the drain terminal is reverse biased relative to the well region; and
the switching circuit substantially simultaneously biases the buried region at zero volts or reverse bias relative to the substrate portion of the semiconductor substrate when the drain terminal is forward biased relative to the well region.

23. The semiconductor component of claim 21 wherein:
the MOS transistor further comprises:
 an intrinsic bipolar junction transistor formed at least partially from the drain region, the buried region, and the well region;
the intrinsic bipolar junction transistor is active when the drain terminal is forward biased relative to the well region; and
the switching circuit deactivates the intrinsic bipolar junction transistor when the drain terminal is reverse biased relative to the well region.

24. The semiconductor component of claim 21 wherein:
the switching circuit consists of a P-N diode at least partially located in the semiconductor substrate and electrically coupled to the buried region.

25. The semiconductor component of claim 21 wherein:
the switching circuit comprises two P-N diodes at least partially located in the semiconductor substrate and configured in a back-to-back arrangement;
a first one of the two P-N diodes electrically couples together the drain region and the buried region; and
a second one of the two P-N diodes electrically couples together the buried region and an input voltage.

26. The semiconductor component of claim 21 wherein:
the switching circuit comprises:
 a bipolar junction transistor at least partially located in the semiconductor substrate and comprising an emitter terminal, a base terminal, and a collector terminal;
 a Zener diode at least partially located in the semiconductor substrate and electrically coupling together the drain terminal and the base terminal; and
 a resistor electrically coupling the collector terminal to the base terminal and the Zener diode.

27. The semiconductor component of claim 21 wherein:
the switching circuit comprises:
 a resistor electrically coupling together the drain terminal and the buried region; and
 a diode at least partially located in the semiconductor substrate and electrically coupled to the buried region and the resistor.

* * * * *

UNITED STATES PATENT AND TRADEMARK OFFICE
CERTIFICATE OF CORRECTION

PATENT NO. : 6,573,562 B2
DATED : June 3, 2003
INVENTOR(S) : Vijay Parthasarathy et al.

It is certified that error appears in the above-identified patent and that said Letters Patent is hereby corrected as shown below:

Column 13,
Line 8, the claim reference numeral "11" should read -- 12 --.
Line 11, the claim reference numeral "11" should read -- 12 --.

Signed and Sealed this

Twenty-eighth Day of October, 2003

JAMES E. ROGAN
*Director of the United States Patent and Trademark Office*